(12) United States Patent
Schweizer

(10) Patent No.: US 9,379,490 B2
(45) Date of Patent: Jun. 28, 2016

(54) PLUG AND METHOD FOR PRODUCING SAME

(75) Inventor: Dominik Schweizer, Schwerzenbach (CH)

(73) Assignee: REICHLE & DE-MASSARI AG, Wetzikon (CH)

(*) Notice: Subject to any disclaimer, the term of this patent is extended or adjusted under 35 U.S.C. 154(b) by 340 days.

(21) Appl. No.: 14/127,558

(22) PCT Filed: Jun. 15, 2012

(86) PCT No.: PCT/EP2012/002544
§ 371 (c)(1),
(2), (4) Date: Mar. 20, 2014

(87) PCT Pub. No.: WO2012/175184
PCT Pub. Date: Dec. 27, 2012

(65) Prior Publication Data
US 2014/0199890 A1 Jul. 17, 2014

(30) Foreign Application Priority Data

Jun. 21, 2011 (CH) .................................. 1052/11

(51) Int. Cl.
*H01R 13/6463* (2011.01)
*H01R 13/03* (2006.01)
(Continued)

(52) U.S. Cl.
CPC .......... *H01R 13/6463* (2013.01); *H01R 13/035* (2013.01); *H01R 13/6461* (2013.01);
(Continued)

(58) Field of Classification Search
CPC ............. H01R 13/035; H01R 13/6461; H01R 13/6466; H01R 24/64; H01R 43/18; H01R 13/6463; H01R 43/26; Y10T 29/49208; H05K 2201/0236; H05K 2201/09118; H05K 3/185
USPC ............................................. 439/626; 29/876
See application file for complete search history.

(56) References Cited

U.S. PATENT DOCUMENTS 5,030,113 A * 7/1991 Wilson .................. H01R 12/57
439/80
5,626,483 A * 5/1997 Naitoh ................. H01R 13/035
29/884

(Continued)

FOREIGN PATENT DOCUMENTS

CN 1379505 A 11/2002
CN 1643713 A 7/2005

(Continued)

OTHER PUBLICATIONS

Office action issued Sep. 22, 2015 in the corresponding CN application No. 201280030813.4 (with English translation).

(Continued)

*Primary Examiner* — Edwin A. Leon
(74) *Attorney, Agent, or Firm* — Posz Law Group, PLC

(57) ABSTRACT

A plug for an electrical plug-type connector includes a plurality of plug contacts, which are electrically connected or connectable to a corresponding number of connecting elements, for example insulation displacement contacts, clamping contacts or possibly also soldered joints, each for connecting one electrical cable core. Per plug contact, one conductor is formed as a conductor track which is grown three-dimensionally on the surface of a plug body in the form of a cast plastics part and adheres there, and which both forms the plug contact and electrically connects the plug contact to the connecting element.

20 Claims, 2 Drawing Sheets

(51) Int. Cl.
*H01R 13/6461* (2011.01)
*H01R 13/6466* (2011.01)
*H01R 24/64* (2011.01)
*H01R 43/18* (2006.01)
*H01R 43/26* (2006.01)
*H05K 3/18* (2006.01)

(52) U.S. Cl.
CPC ............ *H01R13/6466* (2013.01); *H01R 24/64* (2013.01); *H01R 43/18* (2013.01); *H01R 43/26* (2013.01); *H05K 3/185* (2013.01); *H05K 2201/0236* (2013.01); *H05K 2201/09118* (2013.01); *Y10T 29/49208* (2015.01)

(56) References Cited

U.S. PATENT DOCUMENTS

| | | | |
|---|---|---|---|
| 7,273,401 B2 * | 9/2007 | Zaderej | ............... H01P 1/04 439/736 |
| 8,413,323 B2 | 4/2013 | Bresche et al. | |
| 2002/0142673 A1 | 10/2002 | Hosaka et al. | |
| 2006/0264106 A1 | 11/2006 | Bresche et al. | |
| 2008/0166919 A1 | 7/2008 | Bresche et al. | |
| 2011/0287670 A1 | 11/2011 | Bresche et al. | |

FOREIGN PATENT DOCUMENTS

| | | |
|---|---|---|
| CN | 100534258 C | 8/2009 |
| DE | 19529380 C1 | 3/1997 |
| DE | 10217292 A1 | 11/2003 |
| EP | 1246308 A2 | 10/2002 |
| EP | 1274288 B1 | 1/2003 |
| EP | 1246308 A3 | 8/2003 |
| EP | 1487037 A1 | 12/2004 |
| JP | 2001-267020 A | 9/2001 |
| JP | 2008-078156 A | 4/2008 |
| JP | 2009-004284 A | 1/2009 |
| WO | 98/55669 A2 | 12/1998 |
| WO | 2004/082343 A1 | 9/2004 |
| WO | 2009002513 A2 | 12/2008 |

OTHER PUBLICATIONS

Office Action issued Oct. 6, 2015 in the corresponding JP application No. 2014-516223 (with English translation).
International Search Report of the International Searching Authority mailed Sep. 10, 2012 for the corresponding international application No. PCT/EP2012/002544 (with English translation).
International-type Search Report issued in the corresponding CH application No. 1052/2011 (with Partial English translation).
Witten Opinion of the International Searching Authority mailed Sep. 10, 2012 for the corresponding international application No. PCT/EP2012/002544 (with English translation).
International Preliminary Report on Patentability dated Dec. 23, 2013 for the corresponding international application No. PCT/EP2012/002544 (with English translation).

* cited by examiner

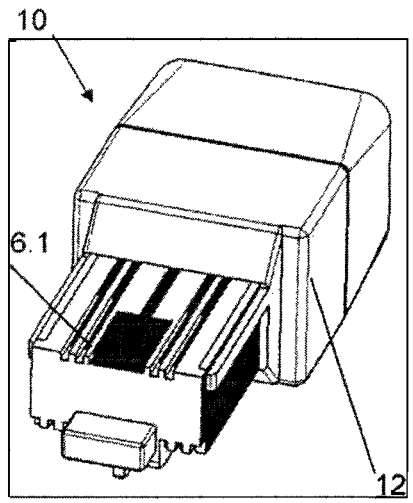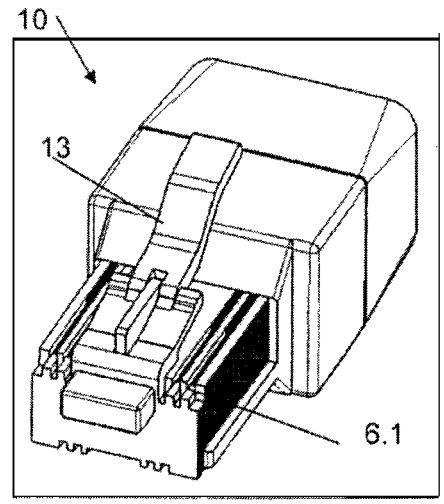
Fig. 3  Fig. 4
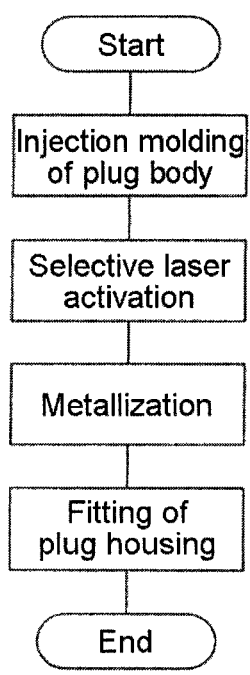
Fig. 5

PLUG AND METHOD FOR PRODUCING SAME

CROSS REFERENCE TO RELATED APPLICATIONS

This application is a U.S. national stage application of International Patent Application No. PCT/EP2012/002544 filed on Jun. 15, 2012, and claims priority to, and incorporates by reference, Swiss Patent Application No. 1052/11 filed on Jun. 21, 2011.

BACKGROUND

The invention relates to the field of plug-type connectors for electrical data transmission. It relates in particular to a plug.

Plugs of the standardized type RJ-45 or else corresponding Cat. 7 plugs are usually composed of many individual elements which perform both mechanical and electromagnetic functions. In known plug embodiments, up to several dozen individual parts are included. In addition to a housing, there are the printed circuit board(s), contact elements, IDCs, shielding plates etc., wherein elements which need to be in electrical contact with one another are soldered to one another or compressed with one another. This has considerable effects on the manufacturing costs, in particular as a result of the assembly. Furthermore, mechanical tolerances can result in problems with respect to the transmission performance.

DESCRIPTION OF THE INVENTION

The objective of the present invention consists in providing a plug which overcomes disadvantages of the prior art and which is in particular constructed from fewer component parts and preferably achieves a high performance (i.e., for example, at least Cat.6, and in particular at least Cat.6A).

This objective is achieved by the invention as defined in the patent claims.

In accordance with one aspect of the invention, a plug for an electrical plug-type connector is provided which has, as is known per se, a plurality of plug contacts, which are electrically connected or connectable to a corresponding number of connecting elements, for example insulation displacement contacts, clamping contacts or possibly also soldered joints, each for connecting one electrical cable core. The plug is now characterized by the fact that, per plug contact, one electrical conductor (referred to below as "conductor") is implemented as a conductor track which is grown 3-dimensionally on the surface of a plastics part and adheres there and which both forms the plug contact and electrically connects said plug contact to the connecting element, and which includes electromagnetic compensation for achieving the desired performance.

A conductor track runs three-dimensionally when it is not restricted to a 2-dimensional plane (i.e. when there is no 2D plane in which the entire track runs). The conductors in this case run on the surface of a 3D body, which differs from a (printed circuit) board (PCB) in terms of its 3D configuration. In particular, the plastics body forms, for example, the plug body, and at least one region of the plug body forming the plug part has substantially the form required by the plug standard, i.e. forms the plug face (wherein another plug housing fitted on the plug body with the conductor tracks can be provided).

The plug according to the invention is generally a plug for twisted-pair cable connections. It has, for example, at least two, at least four, at least six or often at least eight plug contacts. The plug contacts are usually at least partially in the form of parallel strip-shaped contacts on the plug body surface. They can either all be arranged parallel to one another and on the same plane next to one another on the plug body, as is often applied in the case of known RJ-45 plugs, or a plurality of pairs of parallel plug contacts which are on a plane next to one another can be provided, as is known, for example, in the case of plugs which correspond to the standards which meet the Cat. 7 and Cat. 7A requirements.

The plastics body is generally produced in a casting method, in particular in an injection-molding method.

In many embodiments, the plug body is produced from a thermoplastic plastic or a plurality of thermoplastic plastics. The conductors are applied using a method known per se from the molded interconnect device (MID) technology. The plug body can then be interpreted as an injection-molded circuit carrier (molded interconnect device MID).

Laser direct structuring is particularly suitable; two-component injection-molding methods can also be used. In the laser direct structuring (LDS) method, the plug body is selectively surface-activated after the casting: the conductor tracks are quasi written on the surface with the laser beam (for example a UV laser). Thereupon, the conductor tracks are metallized in currentless fashion or galvanically in a bath.

The two-component injection-molding method representing an alternative to this provides for a metallizable plastic to form the surface regions on which the conductor tracks are intended to emerge and for a non-metallizable plastic to form the remaining surface regions. In this case, either the metallizable (then electrically nonconductive) plastic can form the actual body of the plastics part and may have been injection-molded in the first operation, or the non-metallizable plastic forms the plastics body.

Further alternative solutions are also conceivable, including subtractive methods. At present, LDS and two-component injection molding appear to be particularly suitable for the purposes of the invention.

MID in general and LDS and two-component injection molding specifically are methods known per se, and the details of these methods will not be discussed any further here. Until now, these methods have been known for producing conventional interconnects with special physical structures and for producing conductor tracks on housing parts, for example as mobile radio antennas. The invention is based on the knowledge that these methods can result in considerable advantages in the production of a plug, in particular while reducing the required number of component parts and therefore making savings in terms of manufacturing costs.

The conductors run, for example, from the points at which they form the plug contacts as far as the connecting elements (for example IDCs), with the result that, in addition to the conductor, at most one connecting element which clamps the cable cores and/or cuts into said cable cores, for example is integral therewith, is provided between the jack contact, with which contact is to be made by the plug contact, and the cable core. In other words, the conductors which have been grown are the only required conductors, and the plug body with the grown conductors replaces a large number of individual parts (contact set, compensation, plug body).

The conductors can run sectionally parallel to one another on the plastics body surface. They can in particular form pairs, for example four pairs, of regionally parallel transition sections which connect the plug contacts to the connecting elements.

The conductors can run on different sides of the plug body from the plug contacts (or from the plug contact zone) in the direction towards the connecting elements (connection zone), for example on at least two sides ("on the top" and "on the bottom"; the terms "top" and "bottom" or the like should naturally not represent any restriction to the orientations in which the plug can be used) or on other sides. If appropriate, in addition regions of some conductors can also be guided along the distal end face, for example regions of those conductors which have further regions guided along the lower side.

The conductors formed on the plastics body surface also have compensation regions. Such compensation regions are formed by conductor track parts, which run differently from a direct connection of the plug contacts to the connecting elements and are implemented, for example, to be forked and/or meandering and/or with a plurality of tracks running parallel to one another in order to effect, in a predetermined manner known per se, electromagnetic (generally inductive and capacitive) coupling between conductors which do not form a conductor pair of the "twisted-pair" cable and thus compensate for crosstalk. The compensation of the crosstalk often requires particularly finely forked conductor parts; and a finding of the invention consists in that the procedure with conductor tracks grown 3-dimensionally on the surface of a plastics part is firstly well suited to such compensating portions and secondly the advantages of the method come to the fore in particular in this case.

In embodiments, the conductors are restricted to the surface of the plastics body and are free of conductor track sections which run in deeper layers below the surface and are connected to the surface by means of vias, for example; likewise, they are preferably free of any vias. They are then exclusively formed by the conductors grown on the surface.

Such multilayered embodiments are not excluded, however (for example two-component injection molding).

A method for producing a plug comprising at least two, preferably at least six, plug contacts has the following method steps:
casting the three-dimensional, i.e. with a form different than a flat form (plate form), plug body from plastics;
selectively attaching metallic conductor tracks onto the plug body in such a way that they form conductors which are arranged and implemented in such a way that they form both the plug contacts and electrical connections between the plug contacts and connecting elements for connecting cable cores; and
fitting a plug housing which partially covers the conductor tracks.

The plug housing, irrespective of the selected method, can be used for protecting those regions of the conductors which are different than the plug contacts. Together with the plug body, the plug housing can define the form of the plug. Furthermore, the plug housing can have latching means, for example a latch, which interact with corresponding means of a jack or an adaptor in order to latch the plug.

BRIEF DESCRIPTION OF THE DRAWINGS

In the figures:
FIGS. 3 and 4 each show a view of a plug of the type GG45 (Cat. 7 and Cat. 7A);
and
FIG. 5 shows a diagram showing the method steps of a production method for the plug.

DETAILED DESCRIPTION OF THE INVENTION

Figure 1:
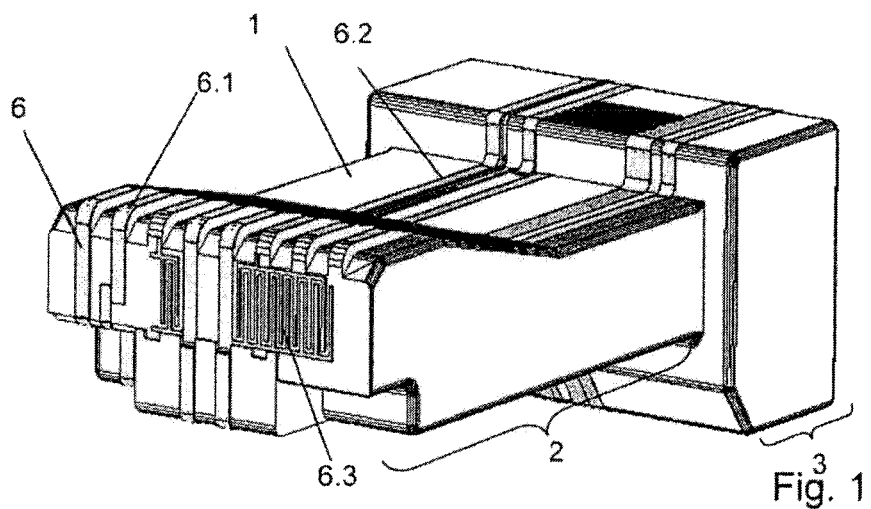
FIG. 1 shows a view of a plug body for a plug according to the invention.

An exemplary embodiment of the invention will be described in detail below with reference to figures. In the figures, the same reference symbols denote identical or analogous elements. The plug body 1 shown in FIG. 1 is formed from a suitable thermoplastic in the injection-molding method. The thermoplastic has suitable component parts to make it suitable for use with the laser direct structuring method, for example nonconductive metal chelate complexes, with the result that metallization nuclei can be formed on the surface by laser activation. A corresponding teaching can be found in WO 98/55669 or EP 1 274 288, for example. Conductor tracks 6 are formed on the surface of the plug body, which conductor tracks have been produced by deposition on the activated surface regions in a metallization bath.

Instead of the method by means of activation of a surface provided with metal chelate complexes, other methods using MID technologies are also conceivable, including methods with previous deposition of layers (primer layers, metallizations etc.) and the two-component injection-molding method.

The plug body has a front (distal) plug part 2 and a rear (proximal) connection part 3.

The conductor tracks 6 on the surface form, in the embodiment illustrated here, the entire conductor system of the plug, with the exception of the (for example IDC) connecting elements for connecting the cable cores. Parallel, equidistant regions 6.1 of the conductor tracks in this case form the plug contacts, as required by the standards for the RJ-45 group. Furthermore, the conductor tracks 6 have transition regions 6.2, which connect the plug contacts 6.1 to the connecting elements (not shown in FIG. 1). Furthermore, compensation regions 6.3 are shown, in which the conductor tracks run differently from a direct connection of the plug contacts to the connecting elements and are implemented to be forked or meandering, for example, in order to compensate for crosstalk in the predetermined manner known per se.

The embodiment depicted of an RJ-45 plug meets the specifications of category 6A. Similarly, plugs for GG45 or Cat. 7 and Cat. 7A plug-type connections can also be produced.

As is known per se from RJ-45 plug-type connections, the conductors form conductor pairs, which need to be assigned to cable core pairs which are twisted with one another of the "twisted-pair" cable connection. Specifically, the conductor pairs 1,2; 3,6; 4,5; and 7,8 each form a pair; in the example illustrated, the pairs 1,2 and 3,6 are guided along the upper side of the plug body and the pairs 4,5 and 7,8 are guided along the lower side.

The plug will have, in addition to the plug body depicted with conductor tracks, the already mentioned connecting elements (for example IDCs) and possibly separate plug parts holding said connecting elements. Furthermore, a plug housing can be provided which surrounds the plug part and possibly also the connection part, wherein slots are provided at the location of the plug contacts 6.1, as is known per se from RJ-45 plug housings, through which slots sprung jack contacts can engage and can make contact with the plug contacts.

Figure 2:
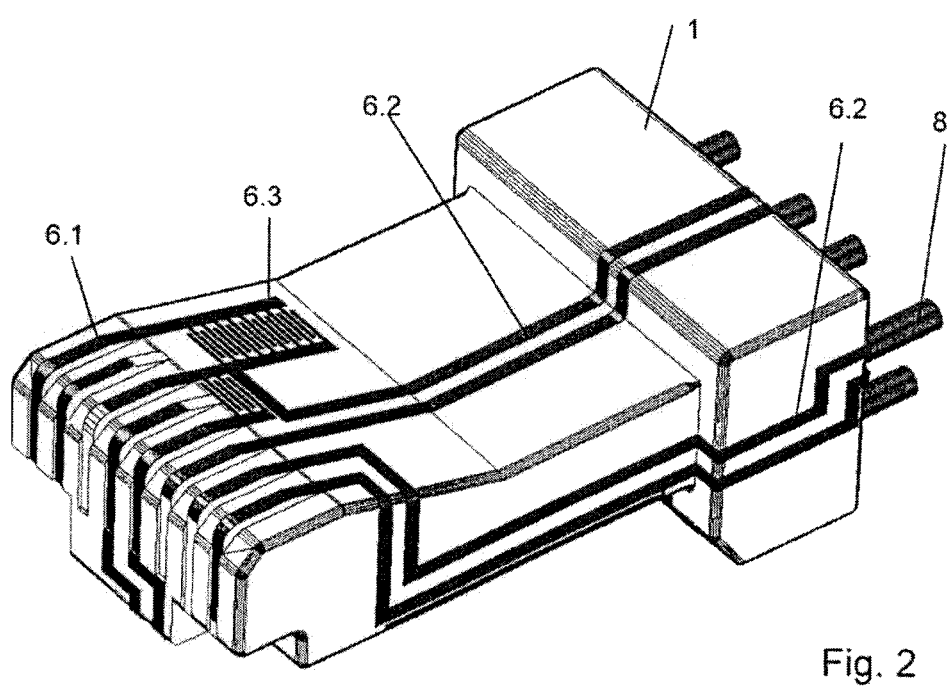
FIG. 2 shows a view of an alternative plug body.

A further embodiment of a plug body 1 is depicted in FIG. 2. In contrast to the embodiment shown in FIG. 1, the compensation regions 6.3 are not provided primarily at the distal end face of the plug, but on the upper and lower sides; in addition or alternatively, lateral compensation regions 6.3 are also conceivable. Combinations of these two procedures are also conceivable, i.e. compensation regions on the distal end face and on the upper and/or lower sides and/or laterally.

The embodiments shown in FIGS. 1 and 2 have the common feature that not all of the transition regions 6.2 run on the same side of the plug body, but are guided along different sides for the purpose of reducing crosstalk. In FIG. 1, in each case two pairs of conductor transition regions 6.2 are arranged on the upper and lower sides. In the embodiment shown in FIG. 2, in each case one pair is guided on the upper side, the lower side and on each lateral side. In the embodiment shown in FIG. 2, connecting elements 8 for the electrical conductors (cable cores) are also shown. The connecting elements can have any desired known configuration from the prior art. Connecting elements which directly use the metallizations 6 forming conductors, for example as a result of metallized blind holes into which cable cores are to be inserted or contact-making faces onto which exposed ends of the cable cores are clamped are also conceivable in principle.

As illustrated schematically in FIGS. 3 and 4, the procedure according to the invention is also suitable for other plug types, in particular for twisted-pair cables, than RJ-45. FIGS. 3 and 4 show, schematically, a plug 10 of the type GG45, which is suitable for Cat. 7 cables and Cat. 7A cables. With this type, plug contacts 6.1 are formed in each case both on the upper side and on the lower side, which enables increased spacing between the corresponding conductors in order to further prevent crosstalk. In the case of the plug 10 depicted, a plug housing 12 with latch 13 is laid over the plug body, of which therefore only those plug contacts 6.1 which are exposed in corresponding slots in the plug housing 12 are visible.

FIG. 5 also schematically illustrates a production method for a plug: in a first step, the plug body is produced directly in its final form by casting, for example injection molding. Then, the selective activation of the surface is performed using a suitable laser, and then the metallization of the activated surface regions, for example in the deenergized metallization bath. Once the metallization has been performed, the plug body is already finished. Then, in general, a plug housing is fastened, and possibly connecting elements are fastened (not illustrated in FIG. 5), for example by clamping, soldering or any other connection techniques. The attachment of the connecting elements can take place prior to or after the attachment of the plug housing. If the connecting elements are soldered joints, they can also be fitted only during wiring and in this case do not belong to the plug itself.

The invention claimed is:

1. A plug for an electrical plug-type connector, comprising a plurality of plug contacts;
an electrical connection to a corresponding number of connecting elements each for connecting one electrical cable core; and
a cast plastics part forming a plug body,
wherein said plastics part comprises a plurality of conductors which adhere to the surface of the plastics part, run along a three-dimensional path and form the plug contacts of the plug and electrically connect said plug contacts to the respective assigned connecting element and have compensating portions for reducing crosstalk.

2. The plug according to claim 1, wherein the plug body comprises an injection-molded plug body.

3. The plug according to claim 1, wherein the conductors are applied as metallic conductors to the plug body by virtue of, in a first step, the surface of the plug body is configured as only regionally metallizable and the metallized regions are provided where the conductors are intended to emerge, and by, in a second step, the conductors are applied by metallization of these regions.

4. The plug according to claim 1, further comprising at least eight plug contacts.

5. The plug according to claim 1, wherein said plug meets the standardized requirements for a plug for twisted-pair cable connections.

6. The plug according to claim 1, wherein the conductor tracks run on different sides of the plug body.

7. The plug according to claim 1, wherein the conductors, forming the plug contacts, connect said plug contacts, directly and without any interposed elements other than the conductors, to the connecting elements.

8. The plug according to claim 1, further comprising:
a plug housing plug housing which at least partially surrounds the plug body and which partially covers the conductors, wherein
the plug contacts are exposed in openings in the plug housing.

9. The plug according to claim 8, wherein
a form of a plug housing interior at least regionally corresponds to an outer form of the plug body.

10. A method for producing a plug comprising;
at two plug contacts, in particular according to claim 1, wherein
said method having the following method steps of:
casting a three-dimensional plug body from plastics;
selectively attaching metallic conductor tracks to the plug body and forming said conductor tracks into conductors which are arranged and implemented to form the plug contacts and electrical connections between the plug contacts and connecting elements for connecting cable cores; and
mounting a plug housing, which partially covers the conductor track.

11. The plug according to claim 2, wherein
the conductors are applied as metallic conductors to the plug body by virtue of, in a first step, the surface of the plug body is configured as only regionally metallizable and the metallized regions are provided where the conductors are intended to emerge, and by, in a second step, the conductors are applied by metallization of these regions.

12. The plug according to claim 2, further comprising at least eight plug contacts.

13. The plug according to claim 3, further comprising at least eight plug contacts.

14. The plug according to claim 2, wherein
said plug meets the standardized requirements for a plug for twisted-pair cable connections.

15. The plug according to claim 3, wherein
said plug meets the standardized requirements for a plug for twisted-pair cable connections.

16. The plug according to claim 4, wherein said plug meets the standardized requirements for a plug for twisted-pair cable connections.

17. The plug according to claim 2, wherein
the conductor tracks run on different sides of the plug body.

18. The plug according to claim 3, wherein
the conductor tracks run on different sides of the plug body.

19. The plug according to claim 4, wherein
the conductor tracks run on different sides of the plug body.

20. The plug according to claim 5, wherein
the conductor tracks run on different sides of the plug body.

* * * * *